United States Patent [19]
Smith et al.

[11] Patent Number: 5,727,110
[45] Date of Patent: Mar. 10, 1998

[54] ELECTRO-OPTIC INTERFACE FOR FIELD INSTRUMENT

[75] Inventors: Michael J. Smith, Eden Prairie; George C. Hausler, Maple Grove, both of Minn.

[73] Assignee: Rosemount Inc., Eden Prairie, Minn.

[21] Appl. No.: 547,536

[22] Filed: Oct. 24, 1995

Related U.S. Application Data

[60] Provisional application No. 60/004,607, Sep. 29, 1995.

[51] Int. Cl.$^6$ .................... G02B 6/36; G02B 6/42
[52] U.S. Cl. .................. 385/147; 359/163; 359/173; 361/728; 385/12; 385/53
[58] Field of Search .................. 385/12, 13, 24, 385/134–140, 147, 53; 359/141, 152, 163, 173, 176–179, 188, 195; 174/70 R, 70 S; 361/600, 679, 728, 730, 736, 807

[56] References Cited

U.S. PATENT DOCUMENTS

| | | | |
|---|---|---|---|
| 3,253,588 | 5/1966 | Vuillemier et al. | 128/696 |
| 3,964,020 | 6/1976 | Dickerson | 340/146 |
| 3,989,942 | 11/1976 | Waddoups | 250/199 |
| 4,091,734 | 5/1978 | Redmond et al. | 102/70.2 R |
| 4,107,518 | 8/1978 | McMahon | 250/199 |
| 4,183,054 | 1/1980 | Patisaul et al. | 358/86 |
| 4,290,146 | 9/1981 | Adolfsson et al. | 455/612 |
| 4,316,141 | 2/1982 | Adolfsson et al. | 324/96 |
| 4,321,707 | 3/1982 | Beasley et al. | 455/606 |
| 4,345,482 | 8/1982 | Adolfsson et al. | 73/862.59 |
| 4,346,478 | 8/1982 | Sichling | 455/612 |
| 4,381,144 | 4/1983 | Breslau | 396/27 |
| 4,404,521 | 9/1983 | Fennell | 324/110 |
| 4,408,123 | 10/1983 | Sichling et al. | 250/226 |
| 4,417,140 | 11/1983 | Adolfsson et al. | 250/227 |
| 4,434,510 | 2/1984 | Lemelson | 455/603 |
| 4,457,582 | 7/1984 | Lewis et al. | 350/96.2 |
| 4,479,264 | 10/1984 | Lockett et al. | 455/605 |

(List continued on next page.)

FOREIGN PATENT DOCUMENTS

| | | |
|---|---|---|
| 0 511 482 A1 | 11/1992 | European Pat. Off. . |
| 2273371 | 12/1975 | France . |
| 1256568 | 12/1967 | Germany . |
| 45-13764 | 6/1970 | Japan . |
| 49-138855 | 3/1973 | Japan . |
| 51-24103 | 2/1976 | Japan . |

(List continued on next page.)

OTHER PUBLICATIONS

Press release, "Transmitters Powered by Fiber Optics? That's NT—New Technology," NT International, Sep. 1994. (4 pp.).

Cucci, Gerald R., "Light–Powered Systems, a Fiberoptic Interconnect Technology for Process Control." (6 pp.) (No Journal Name or Date).

Product Data Sheet, "Model 3044C Smart Temperature Transmitters," Rosemount Measurement, pp. 1–15, Oct. 1993.

Banwell, Thomas C. et al., "Powering the Fiber Loop Optically—a cost Analysis," *Journal of Lightwave Technology*, vol. II, No. 3, pp. 481–494, Mar. 1993.

(List continued on next page.)

*Primary Examiner*—John D. Lee
*Attorney, Agent, or Firm*—Westman, Champlin & Kelly, P.A.

[57] ABSTRACT

A remotely powered field instrument comprises a housing with an electronics compartment, a terminal compartment, and a bulkhead separating the electronics compartment from the terminal compartment. A first electrical lead extends through the bulkhead. A mounting plate is secured within the terminal compartment. An interface module is positioned within the terminal compartment and secured to the mounting plate. The interface module comprises an optical connector, an optical-to-electrical converter coupled to the optical connector and a second electrical lead coupled between the optical-to-electrical converter and the first electrical lead.

25 Claims, 7 Drawing Sheets

U.S. PATENT DOCUMENTS

| | | | |
|---|---|---|---|
| 4,487,206 | 12/1984 | Aagard | 128/667 |
| 4,490,606 | 12/1984 | Lockett et al. | 250/227 |
| 4,521,684 | 6/1985 | Gilby et al. | 250/227 |
| 4,525,873 | 7/1985 | Baües | 455/600 |
| 4,525,874 | 7/1985 | Baües | 455/600 |
| 4,591,950 | 5/1986 | Houpt | 361/399 |
| 4,596,925 | 6/1986 | Gilby | 250/227 |
| 4,651,571 | 3/1987 | McGlade | 73/773 |
| 4,662,002 | 4/1987 | Davis et al. | 359/141 |
| 4,700,352 | 10/1987 | Shikada et al. | 372/20 |
| 4,704,607 | 11/1987 | Teather et al. | 340/825.07 |
| 4,710,977 | 12/1987 | Lemelson | 455/603 |
| 4,713,540 | 12/1987 | Gilby et al. | 250/231 R |
| 4,717,240 | 1/1988 | Gilby | 350/163 |
| 4,733,561 | 3/1988 | Gilby | 73/579 |
| 4,777,661 | 10/1988 | Spillman, Jr. | 455/605 |
| 4,789,213 | 12/1988 | Heywang et al. | 350/96.15 |
| 4,820,916 | 4/1989 | Patriquin | 250/227 |
| 4,857,727 | 8/1989 | Lenz et al. | 250/227 |
| 4,879,763 | 11/1989 | Wood | 455/607 |
| 4,887,312 | 12/1989 | Dannhaeuser | 455/607 |
| 4,899,044 | 2/1990 | Hansen et al. | 250/227 |
| 4,905,309 | 2/1990 | Maisonneuve et al. | 455/603 |
| 4,928,319 | 5/1990 | Pitt et al. | 455/612 |
| 4,948,960 | 8/1990 | Simms et al. | 250/227.11 |
| 4,963,729 | 10/1990 | Spillman et al. | 250/227.21 |
| 4,984,297 | 1/1991 | Manome | 455/619 |
| 5,010,770 | 4/1991 | Berthold | 73/702 |
| 5,083,457 | 1/1992 | Schultz | 73/146.5 |
| 5,099,144 | 3/1992 | Sai | 250/551 |
| 5,119,679 | 6/1992 | Frisch | 73/705 |
| 5,162,935 | 11/1992 | Nelson | 359/143 |
| 5,170,274 | 12/1992 | Kuwata et al. | 359/182 |
| 5,185,814 | 2/1993 | Healey | 385/24 |
| 5,195,374 | 3/1993 | Parsons et al. | 73/704 |
| 5,258,868 | 11/1993 | Jensen et al. | 359/168 |
| 5,274,490 | 12/1993 | Tsushima et al. | 359/191 |
| 5,301,553 | 4/1994 | Schultz et al. | 73/705 |
| 5,315,426 | 5/1994 | Aoki | 359/180 |
| 5,351,149 | 9/1994 | Crimmins | 359/181 |
| 5,361,157 | 11/1994 | Ishikawa et al. | 359/168 |
| 5,412,497 | 5/1995 | Kaetsu et al. | 359/163 |

FOREIGN PATENT DOCUMENTS

| | | |
|---|---|---|
| 59-105730 | 6/1984 | Japan . |
| 60-1564 | 1/1985 | Japan . |
| 61-4159 | 2/1986 | Japan . |
| 62-33535 | 7/1987 | Japan . |
| 64-10880 | 2/1989 | Japan . |
| 2-48959 | 10/1990 | Japan . |
| 3-5637 | 1/1991 | Japan . |
| 3-198442 | 8/1991 | Japan . |
| 2 189 361 | 10/1987 | United Kingdom . |
| WO 94/12960 | 6/1994 | WIPO . |

OTHER PUBLICATIONS

Todd, John R. et al, "Digital Flight Control Systems: Some New Commercial Twists," The 10th Digital Avionics Systems Conference, McDonnell Douglas Corporation, Los Angeles, CA, Oct. 14–17, 1991. (Paper 91K0041—6 pp.).

Beaumont, B. et al., "High Efficiency Conversion of Laser Energy and its Application to Optical Power Transmission," IEEE-PVSC, Proc. 22nd, Las Vegas, Oct., 1991. (5 pp.).

Landry, M. et al., "Power-by-light Systems and Their Components: An Evaluation," Applied Optics, vol. 30, No. 9, Mar. 20, 1991, pp. 1052–1061.

Sun, M. et al., "Fiber Optic Pressure Sensor," SPIE, vol. 1589, (1991), pp. 83–89. [No Month].

Henderson, Breck W., "Varian Develops Technology to Send Power Via Fiber Optics," Aviation Week & Space Technology, Aug. 13, 1990, p. 74.

Todd, John R. et al., "Development of Fly-by-Light Systems for Commercial Aircraft," Symposium on Opto-Electronic and Fiber Optic Devices and Applications, San Jose, CA, Sep. 16–21, 1990, pp. 1–7. (Douglas Paper 8505).

"Fiber Optics Sensors and Systems," Jun. 1990, pp. 16–18. (No Author or Journal Name).

Spitzer, M.B. et al., "Monolithic Series–Connected Gallium Arsenide Converter Development," pp. 1–5. (No Journal Name or Date).

Kirkham, H. et al., "Optically Powered Data Link for Power System Applications," IEEE Transactions on Power Delivery, vol. 4, No. 4, Oct. 1989, pp. 1997–2004.

Todd, John R., "Development of Fly-by-Light Systems," Symposium on Opto-Electronic and Fiber Optic Devices and Applications, Boston, MA, Sep. 5–8, 1989, pp. 1–8. (Douglas Paper 8318).

Moss, Tuckerman, "Moving Power Down a Fiber," Photonics Spectra, Jul. 1989, p. 52.

Glomb, W.L. Jr., "Electro–Optic Architecture (EOA) for Sensors and Actuators in Aircraft Propulsion Systems," United Technologies Research Center, East Hartford, CT, Jun. 1989, pp. 1–14.

Seal, D.W., "Multiplexing Electro–Optic Architectures for Advanced Aircraft Integrated Flight Control Systems," McDonnell Douglas Corporation, St. Louis, MO Jun. 1989, pp. ii, B–3, B–4.

Mainard, Curt W., "An Optically Interfaced Propulsion Management System Applied to a Commercial Transport Aircraft," McDonnell Douglas, Dayton, OH, May 22–26, 1989, pp. 1–5. (Douglas Paper 8178).

Miskowicz, Janusz et al, "Telemetric Links Powered by Optical Energy," Przeglad Telekomunikacyny, vol. 61, No. 9, (1988) pp. 269–270. [No Month].

Todd, John R., "Toward Fly–by–Light Aircraft," presented to Society of Photo–Optical Instrumentation Engineer, Boston, MA, Sep. 6–9, 1988, pp. 1–5. (Douglas Paper 8034).

Gross, W., "Fiber–Optic Hybrid Sensors with Optical Power Supply," Siemens Forsch.–u. Entwickl.–Ber., Bd. 17, Nr. 1 (1988), pp. 13–17. [No Month].

Lenz, Jim et al., "Fiber Optic Data Bus for Solid State Sensors," IEEE, 1988, pp. 80–83. [No Month].

Todd, John R., "The Role of Fiber Optics on Commercial Aircraft," Symposium on Fiber Optics and Optoelectronics, San Diego, CA, Aug. 16–21, 1987. (Douglas Paper 7886).

Patriquin, D.R. et al, "Optically Interfaced Sensor System for Aerospace Applications," ISA Transactions, vol. 26, No. 1, Research Triangle Park, NC (1987), pp. 1, 3, 5. [No Month].

Schweizer, Pascal, "Optically Powered Sensors and Network of Associated Sensors," Multilingual Communications Services, Inc., Nice, (1987), pp. 1–10. [No Month].

Bjork, P. et al., "Optically Powered Sensors," Optical Fiber Sensors Conference, New Orleans, LA, pp. 336–339. (THEE4) [No Date Given].

Frankel, D. et al., "Optical Fiber Power Delivery System," SPIE, vol. 721 (1986), pp. 104–110. [No Month].

Peters, A., "The DMX–6000 Distributed Measurement System," Mechanical Engineering, May 1985, pp. 40–42.

Hall, P., "An Optically–Powered Sensor Network," GEC Research Limited, Chelmsford, 2/1–2/3. (No Date).

Ohte, A. et al., "Optically–Powered Transducer with Optical–Fiber Data Link," *SPIE*, vol. 478 (1984), pp. 33–38. [No Month].

Akiyama, K. et al., "Optically–Powered Transducer with Optical–Fiber Data Link," vol. 23, No. 6, (Jun. 30, 1987), pp. 570–575. (Trans. of Soc. of I. & C. Engrs.).

Akiyama, K. et al., "Optically–Powered Temperature Sensor Transducer with Optical–Fiber Data Link," Proc. 22nd SICE Annual Conference, (Jul. 27–29, 1983), pp. 207–208.

Miller, R.C. et al., "Wideband, Bidirectional Lightguide Communication with an Optically Powered Audio Channel," *The Bell System Technical Journal*, vol. 61, No. 7, part 1, (Sep. 1982), pp. 1359–1365.

"Smoke Alarm Uses Fiber Optics for Hazardous Areas," *Electronic Design*, (Sep. 3, 1981), p. 64.

McGowan, M., "Multiple Pressure Transmitters Speak Digital on Two Wires," *Control Engineering*, (Dec. 1979). (2 pp.).

Miller, R.C. et al., "Optically Powered Speech Communication Over a Fiber Lightguide," *The Bell System Technical Journal*, vol. 58, No. 7, (Sep. 1979), pp. 1735–1741.

DeLoach, B.C. et al., "Sound Alerter Powered Over an Optical Fiber," *The Bell System Technical Journal*, vol. 57, No. 11, (Nov. 1978), pp. 3309–3317.

Untgreberger, H. et al., "Application of Optical Transmission in Today's and Future Communication Networks," Paris, (Sep. 27–30, 1976). (Eur. Conf. on O.F. Commun.).

Crump, L., "Powering Transistorized Electronic Devices with Radiated Energy (U)," Department of the Army, Washington, DC, (Feb. 15, 1956), pp. 1–17 (odd only).

Hollmann, H.E., "Designing 'Free–Power' Transistorized," *Electronic Industries & Tele–Tech*, (Sep. 1956), pp. 54–56, 92–95.

Oi, K., "Telemetering," Nikkan Kogyo Shimbun–Sha, pp. 212–218. (No Date).

Lui, K., "Pressure Sensors and Actuators Incorporating Optical Fibre Links," *Sensors and Actuators*, vol. 17, (1989), pp. 501–507. [No Month].

ELECTRO-OPTIC INTERFACE FOR FIELD INSTRUMENT

CROSS REFERENCE TO RELATED APPLICATION

This application claims priority from Provisional application Ser. No. 60/004,607 which is entitled "Electro-Optic Interface For Field Instrument" and was filed Sep. 29, 1995.

BACKGROUND OF THE INVENTION

The present invention relates to an electro-optic interface for a field instrument, and more particularly to an electro-optic interface positioned within a terminal compartment of the field instrument for converting an electrical interface to an optical interface.

Field instruments include various devices, such as transmitters, actuators, transducers, switches and stand-alone controllers. Field instruments are used in process control systems to control the process, measure process variables and to generate outputs representative of the process variables for communication to central controllers or field control elements (e.g. valves) over process control loops. These loops typically include two-wire, three-wire and four-wire process control loops. Other loops have also been used, such as optical and radio frequency control loops.

Field instruments are mounted in a field area where current and voltage levels are typically limited to provide intrinsic safety. The instruments are often powered over the control loop. A separate transducer senses each process variable and provides the sensed variable to a transmitter for transmission to the central controller. Controllers can be located in a central control room or in the field and monitor the transducer outputs to generate appropriate control output signals. Control output signals are typically sent over a separate control loop to remote actuators, such as valves, which control the process according to the control output signals. In certain applications, controllers select the most appropriate set of instructions, for process control equipment.

A typical field instrument includes an explosion-proof housing which is divided by a bulkhead into an electronics compartment and a terminal compartment. The instrument electronics are located in the electronics compartment. Electrical leads for the process control loop extend from the electronics compartment, through the bulkhead to a terminal block in the terminal compartment. The terminal block is mounted within the terminal compartment and provides a terminal for making electrical connections with the process control loop. The terminal compartment is capped by a threaded cover and includes an access port for the loop wires.

Optical interfaces have been used to provide power and information to remote electrical devices over one or more optical fibers. The applications include, among others, industrial process control systems, aircraft flight control systems, communication systems, medical instruments, ordnance and electric power monitoring. Optical interfaces are immune to electromagnetic interference (EMI), radio frequency interference (RFI), noise, lightening, transients and cross-talk which are often problems for control and communication systems which use electrical wires. Optical interfaces also provide electrical isolation and do not create spark or shock hazards which can be dangerous in reactive environments.

SUMMARY OF THE INVENTION

The present invention is directed to an electro-optic interface for converting an electrical interface between a field instrument and a controller to an optical interface. The field instrument comprises a housing with an electronics compartment, a terminal compartment, and a bulkhead separating the electronics compartment from the terminal compartment. A first electrical lead extends through the bulkhead from the electronics compartment to the terminal compartment. The interface comprises a mounting plate and an interface module. The mounting plate is secured within the terminal compartment. The interface module is secured to the mounting plate, also within the terminal compartment. The interface module comprises an optical connector, an optical-to-electrical converter coupled to the optical connector and a second electrical lead coupled between the optical-to-electrical converter and the first electrical lead.

The electro-optic interface has mounting features which allow it to be mounted within the terminal compartment of a plurality of differently sized field instruments, thereby making the conversion convenient, cost-effective and quick. The mounting plate can be formed of an inexpensive molded plastic which has a first surface with a "unique" mounting feature that couples with a particular field instrument. The mounting plate has a second surface with a "universal" mounting feature which couples with a corresponding universal mounting feature on the interface module. The interface module is sized to fit within the terminal compartments of a plurality of differently sized field instruments with the original or an extended cover. By providing a unique mounting plate for each size or type of field instrument, the same interface module can be installed in a number of different field instruments.

The apparatus can be provided as a kit for converting existing electrically based field instruments to optically based field instruments or as an option with new or refurbished field instruments without requiring a change in the structure of the instruments.

DETAILED DESCRIPTION OF THE PREFERRED EMBODIMENTS

The present invention is an electro-optic interface for converting a field instrument from an electrical interface to an optical interface. The interface couples to a plurality of differently sized field instruments without requiring external hardware or connections at the field instrument. The interface has convenient packaging which can be installed easily and quickly. Although the present invention is discussed below with reference to industrial process control systems, the present invention is also applicable to other control systems in which power or information is to be transmitted to a remote field instrument.

Figure 1:
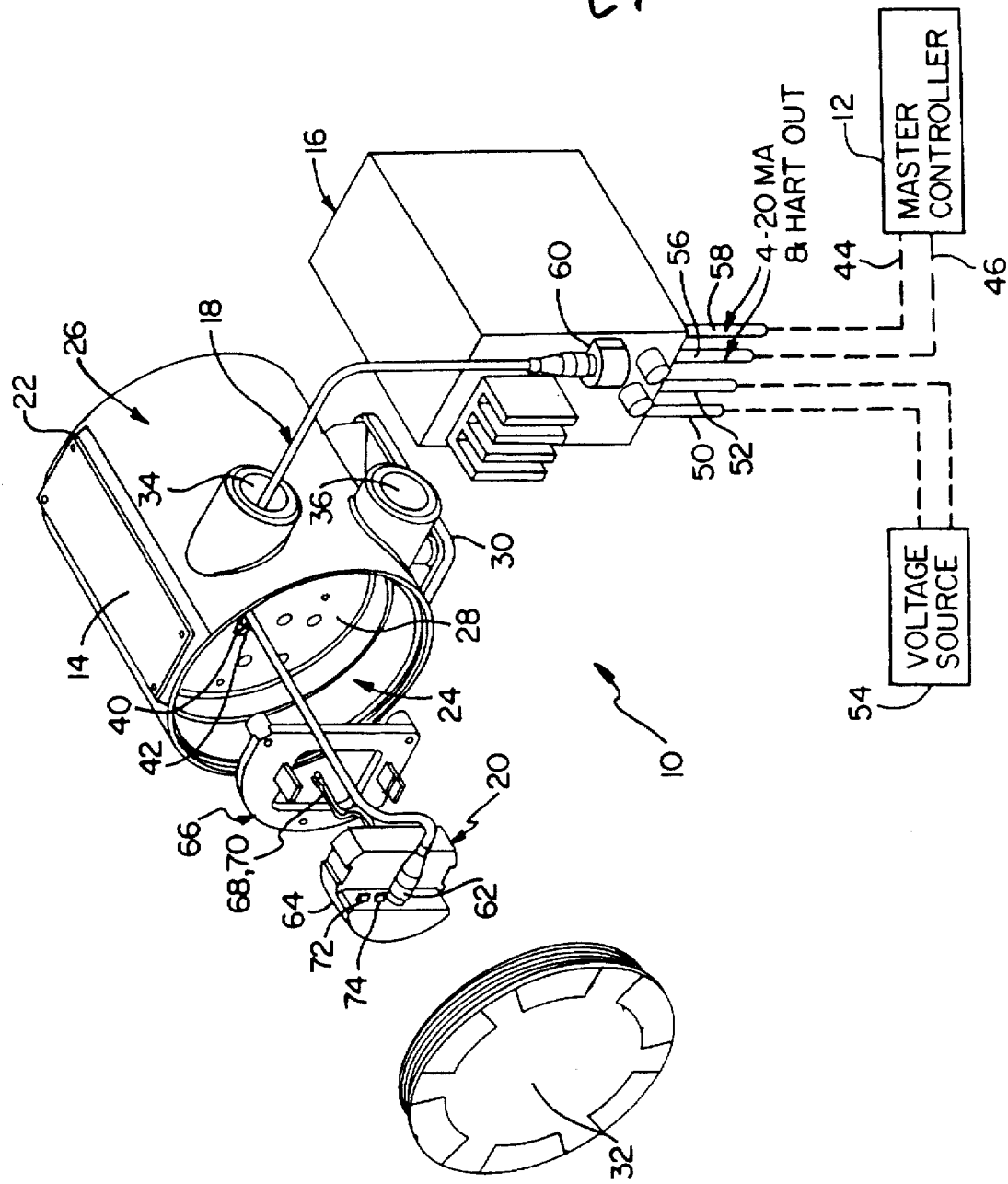
FIG. 1 is a perspective view of an electro-optic interface according to the present invention.

FIG. 1 is a perspective view of an electro-optic interface in a typical industrial process control system. Interface 10 is coupled between master controller 12 and field instrument 14. Interface 10 includes power module 16, fiber 18 and interface module 20.

Master controller 12 can include a variety of devices, such as a central control station, a remote communication device or another control or test device. Field instrument 14 can also include a variety of devices, such as a process variable transmitter, an actuator, a transducer, a switch, a stand alone controller, a valve, a current-to-pressure (I/P) converter or a switch.

Field instrument 14 includes explosion-proof housing 22, terminal compartment 24, electronics compartment 26, bulkhead 28, base 30, cover 32 and access ports 34 and 36. Bulkhead 28 divides the interior of housing 22 into terminal compartment 24 and electronics compartment 26. Cover 32 threads onto housing 22 to seal terminal compartment 24. Access ports 34 and 36 provide access to terminal compartment 24 from outside housing 22. Bulkhead 28 includes electrical terminals 40 and 42 which extend through the bulkhead and are electrically coupled to the instrument within the electronics compartment through radio frequency interference (RFI) filters.

In a traditional system, terminals 40 and 42 would be electrically coupled to a two-wire process control loop through a terminal block (not shown) mounted in the terminal compartment. The two-wire process control loop (a twisted pair of wires) would extend through access port 34 and be coupled to terminals 44 and 46 of master controller 12. A two-wire process control loop transmits and receives signals in the form of 4–20 mA analog signals with superimposed digital data according to a selected protocol, such as the HART® Protocol. The HART® protocol uses a standard frequency shift keying (FSK) technique to modulate the data on the 4–20 mA analog signal. Other protocols can also be used, such as the Fieldbus Communication Standard which is presently being developed by the Fieldbus Foundation, Control Area Network (CAN), MODBUS or a base band modulation such as the DE protocol.

Optical interface 10 replaces the traditional two-wire process control loop to allow for optically powering and bi-directionally communicating with remote electrical devices over a single or dual fiber or through the atmosphere. Power module 16 is enclosed in a well-known DIN style box which is located near master controller 12. Power module 16 includes power supply terminals 50 and 52 which are connected to a nominal 24 volt DC power supply 54. Terminals 56 and 58 are signal terminals which are connected to terminals 44 and 46 of master controller 12. Terminals 44 and 46 carry 4–20 mA analog signals with superimposed digital data. Power module 16 further includes a fiber optic connector 60 which is optically coupled to fiber 18. Fiber 18 can have a single strand or multiple strands threaded through access port 34 and optically coupled to one or more fiber optic connectors 62 on interface module 20.

Interface module 20 is housed in a plastic shroud 64 which is attached to a mounting plate 66. Mounting plate 66 is secured to bulkhead 28 within terminal compartment 24. Shroud 64 can also be secured directly to bulkhead 28. Electrical leads 68 and 70 extend from the electronics within interface module 20 for connection to terminals 40 and 42, respectively, on bulkhead 28. Electrical leads 68 and 70 are also attached to terminals 72 and 74 on shroud 64 for access by a remote transmitter interface (RTI) or other test device. Electrical power and data provided by master controller 12 are converted to an optical beam comprising power and data by power module 16 and transmitted over fiber 18 to interface module 20. Interface module 20 converts the optical beam back into electrical power and data which are provided to field instrument 14 through leads 68 and 70. The transfer of power and data are described in greater detail in Andersson et al. U.S. patent application Ser. No. 08/536, 397, entitled "Optical Interface With Safety Shutdown," filed Sep. 29, 1995, which is hereby incorporated by reference.

Figure 2:
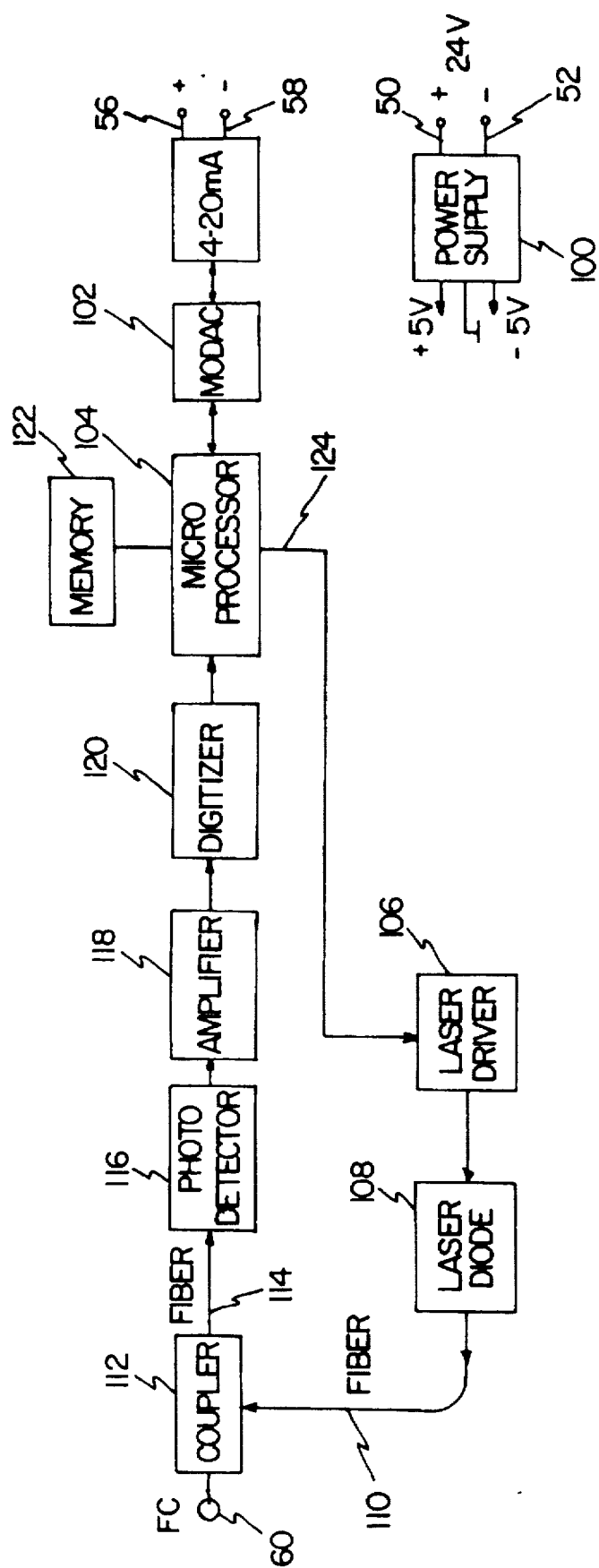
FIG. 2 is a block diagram of a power module of the interface shown in FIG. 1.

FIG. 2 is a block diagram of power module 16. As shown on the right-hand side of the diagram, power supply terminals 50 and 52 are connected to internal power supply 100 which generates a positive and a negative 5-volt supply voltage for operating the various electrical and optoelectronic components in power module 16.

Power module 16 further includes MODAC 102, microprocessor 104, laser driver circuit 106, laser diode 108, fiber 110, fiber optic connector 60, coupler 112, fiber 114, photodetector 116, amplifier 118, digitizer 120 and memory 122. Signal terminals 56 and 58 are coupled to MODAC 102. MODAC 102 is an ASIC developed by Rosemount Inc. which includes a HART® compatible modem (a modulator and demodulator) and a digital-to-analog (D/A) converter. MODAC 102 can be replaced with any suitable modem and digital-to-analog converter together with the appropriate control logic. The modem within MODAC 102 demodulates digital messages received on terminals 56 and 58 and provides the digital messages to microprocessor 104. MODAC 102 also receives digital messages and process variable measurements from microprocessor 104, converts the process variable measurements to 4–20 mA analog signals and modulates the digital messages onto the analog signals, thereby establishing two-way communication with master controller 12 (shown in FIG. 1). The term "process variable" used herein refers to a variable such as pressure, temperature, flow, level, specific gravity, etc., sensed by a transmitter or other sensor such as a process control or aerospace instrument.

Control output 124 of microprocessor 104 provides data and control signals to laser driver circuit 106. During normal operation, microprocessor 104 repetitively requests the value of a process variable being measured by field instrument 14 (shown in FIG. 1). Microprocessor 104 sends a digital request message as a serial data string to laser driver circuit 106 which modulates an upper portion of the output power of laser diode 108, which is transmitted over fiber 110, through coupler 112, out connector 160 and through fiber 18 to interface module 20. Binary one and zero are represented by "on" and "off" states in an upper portion of the output power. The lower portion of the output power of laser diode 108 is pulsed to provide power to interface module 20 and field instrument 14.

An incoming light beam carrying a digital message, such as a response to the request for a process variable measurement, is received at connector 60, passed through coupler 112 and fiber 114, and detected by photodetector 116. The light beam received by photodetector 116 is converted into a weak electrical signal, amplified by amplifier 118, conditioned by digitizer 120, and provided to microprocessor 104. Microprocessor 104 receives the signals in an internal shift register to recover the digital message. Once the digital message has been received, microprocessor 104 provides the digital message to MODAC 102 which converts the digital message into a 4–20 mA analog signal and a HART® FSK output which are applied to terminals 56 and 58.

Figure 3:
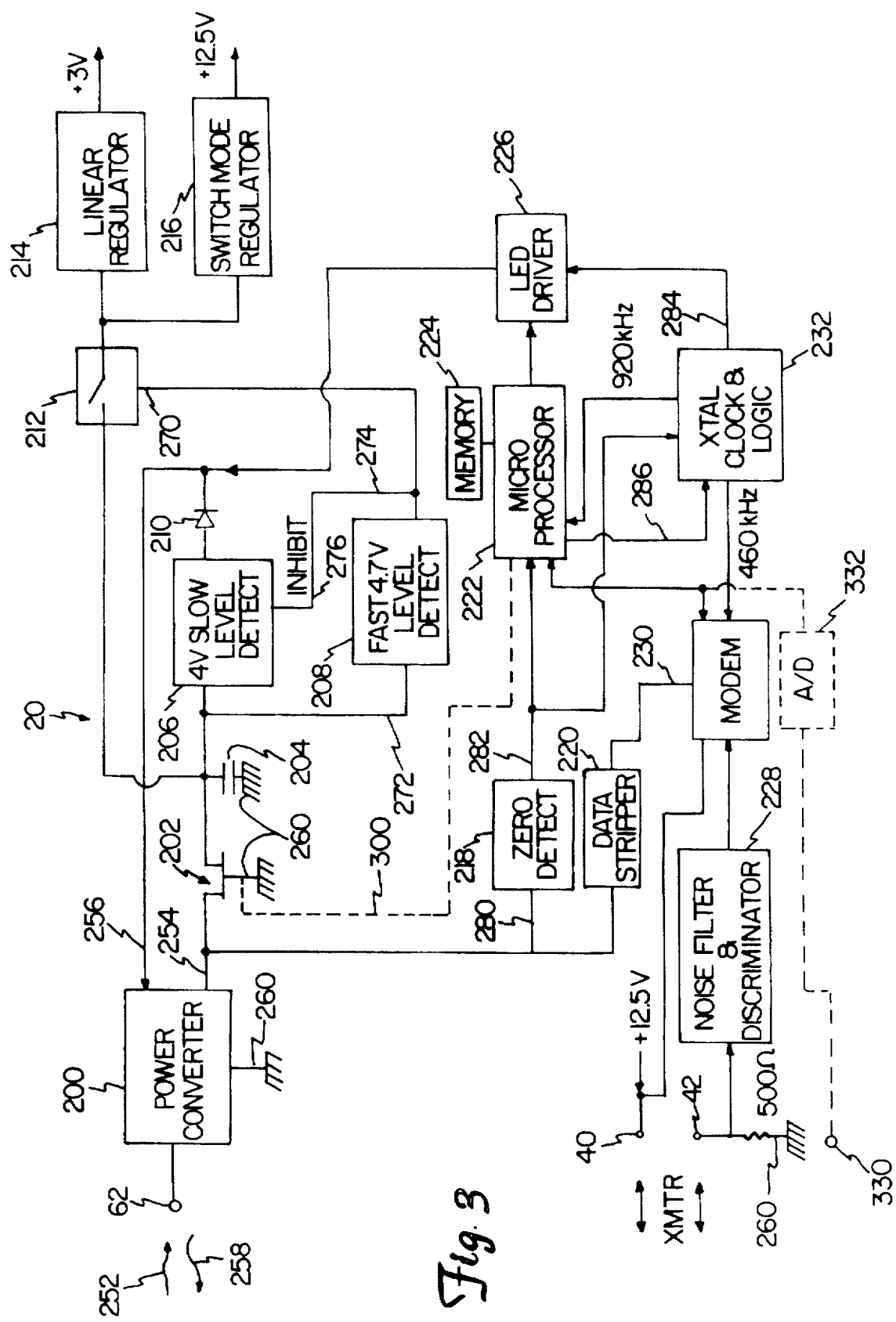
FIG. 3 is a block diagram of an interface module of the interface shown in FIG. 1.

FIG. 3 is a block diagram of interface module 20. Interface module 20 includes power converter 200, transistor 202, energy storage device 204, 4-volt slow level detect circuit 206, fast 4.7-volt level detect circuit 208, diode 210, switch 212, linear voltage regulator 214, switch mode voltage regulator 216, zero detect circuit 218, data stripper 220, microprocessor 222, memory 224, LED driver circuit 226, noise filter and discriminator circuit 228, modem 230 and crystal clock and logic circuit 232.

Connector 62 is optically coupled to power converter 200. Power converter 200 converts light beam 252 received from power module 16 into electrical power which is applied to terminal 254. Likewise, power converter 200 receives electrical signals at terminal 256 and converts the electrical signals into a return light beam 258 for transmission to power module 16. Examples of suitable power converters are provided in the Andersson et al. U.S. Application and in Jensen et al. U.S. Pat. No. 5,258,868, which is hereby incorporated by reference.

Energy storage device (e.g. a capacitor) 204 is electrically coupled to terminal 254 through transistor 202. Switch 212 is connected between capacitor 204 and regulators 214 and 216. Switch 212 has a control input 270 which operates switch 212 between open and closed states. Switch 212 is normally in the open state such that capacitor 204 and power converter 200 are not loaded by regulators 214 and 216 until laser diode 108 is in a high power mode.

When microprocessor 104 (shown in FIG. 2) operates laser diode 108 in a low power mode (approximately 2 mW), the electrical power generated on terminal 254 by power converter 200 slowly charges capacitor. 204. When the voltage across capacitor 204 reaches 4 volts, 4-volt slow level detector circuit 206 discharges capacitor 204 through diode 210 and into the LED in power converter 200, which generates a return safety light pulse that is transmitted to power module 16 through fiber 18. The return safety light pulse is detected by microprocessor 104 during an off state of the pulsed laser diode waveform. Once the optical connection has been verified, microprocessor 104 turns laser diode 108 on to full power.

Fast 4.7-volt level detector circuit 208 has an input 272 electrically coupled to capacitor 204 and a control output 274 which is electrically coupled to an inhibit input 276 of detector 206 and control input 270 of switch 212. Detector 208 has a higher voltage threshold than detector 206 and has a faster response time characteristic. When microprocessor 104 operates laser diode 108 in the high power mode, the electrical power generated by power converter 200 quickly charges capacitor 204, thereby triggering control output 274 of detector 208 which disables detector 206 and closes switch 212 to power regulators 214 and 216. Switch 212 therefore couples regulators 214 and 216 to capacitor 204 only after a sufficient level of charge has developed on capacitor 204 to operate the various electrical components in interface module 20 and in field instrument 14 (FIG. 1). Regulator 214 generates a regulated 3-volt supply voltage for operating the electrical components of interface module 20. Regulator 216 generates a 12.5-volt supply voltage which is applied to terminals 40 and 42 for operating the electronics in field instrument 14.

Microprocessor 230 receives digital messages from field instrument 14 through terminals 40 and 42, which pass through a noise filter and discriminator circuit 228 and modem 230. Modem 230 is a HART® compatible modem which provides the digital message to microprocessor 222 as a serial stream of data. Microprocessor 222 includes a shift register (not shown) which collects the data until a complete digital message is ready for transmission to power module 16. Once microprocessor 222 determines that there is a complete digital message to be transmitted to power module 16, microprocessor 222 generates a control signal 286 which inhibits crystal clock and logic circuit 232 from generating a return safety pulse and begins sending the digital message as a compressed burst of serial data to LED driver 226 after receiving the next zero level output signal from zero detect circuit 218. LED driver 226 modulates the output of the LED in power converter 200 with the digital message.

Likewise, interface module 20 is capable of receiving optically encoded digital messages from power module 16. When light beam 252 generated by laser diode 108 includes an encoded digital message, data stripper 220, which may include a demodulator, strips the digital message (i.e. signal component) off the resulting electrical power applied to terminal 254 and provides the message as a serial string of binary ones and zeros to modem 230. Modem 230 transmits the digital message to field instrument 14 through terminals 40 and 42. Power module 16 and interface module 20 thus provide bidirectional digital communication over fiber 18. Interface module 20 can include various alternative embodiments.

The electrical connections between interface module 20 and field instrument 14 can be modified to provide direct measurements of a process variable over a separate terminal 330. The voltage on terminal 330 represents a direct measurement of the process variable. Terminal 330 is attached to A/D converter 332 (shown in phantom) which is connected in parallel with modem 230 and provides digital process variable measurements to microprocessor 222. For embodiments an analog signal is required to actuate a physical device operated by interface module 20, modem 230 includes a digital-to-analog converter which varies the analog signals on terminals 40 and 42 according to digital messages provided by power module 16.

Figure 4:
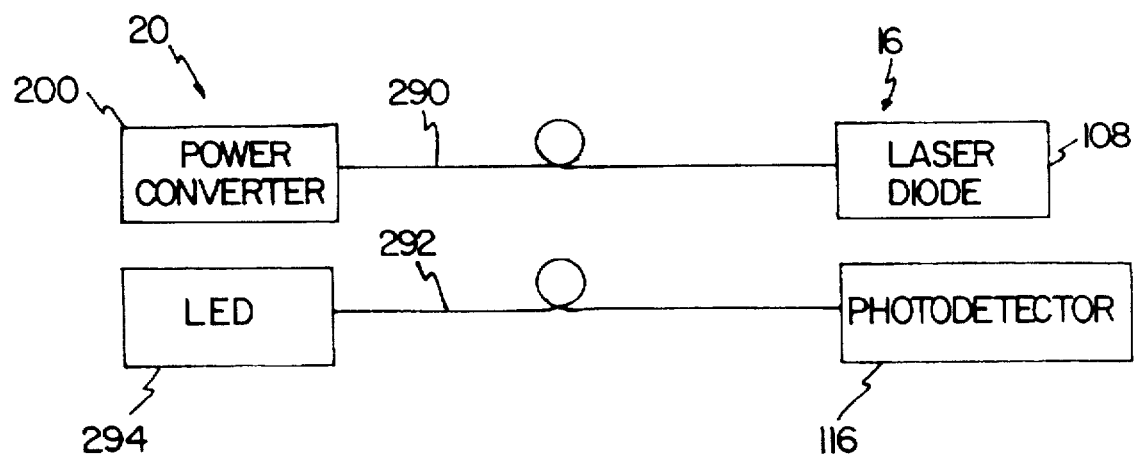
FIG. 4 is a block diagram of an optical interface with two fibers according to an alternative embodiment of the present invention.

FIG. 4 is a diagram of an alternative embodiment in which power module 16 is coupled to interface module 20 through first and second optical fibers 290 and 292. The same reference numerals are used in FIG. 4 for similar elements as were used in the previous figures. Laser diode 108 is coupled to power converter 200 over fiber 290. An LED 294, which is separate from power converter 200, is optically coupled to photodetector 116 through fiber 292.

Figure 5:
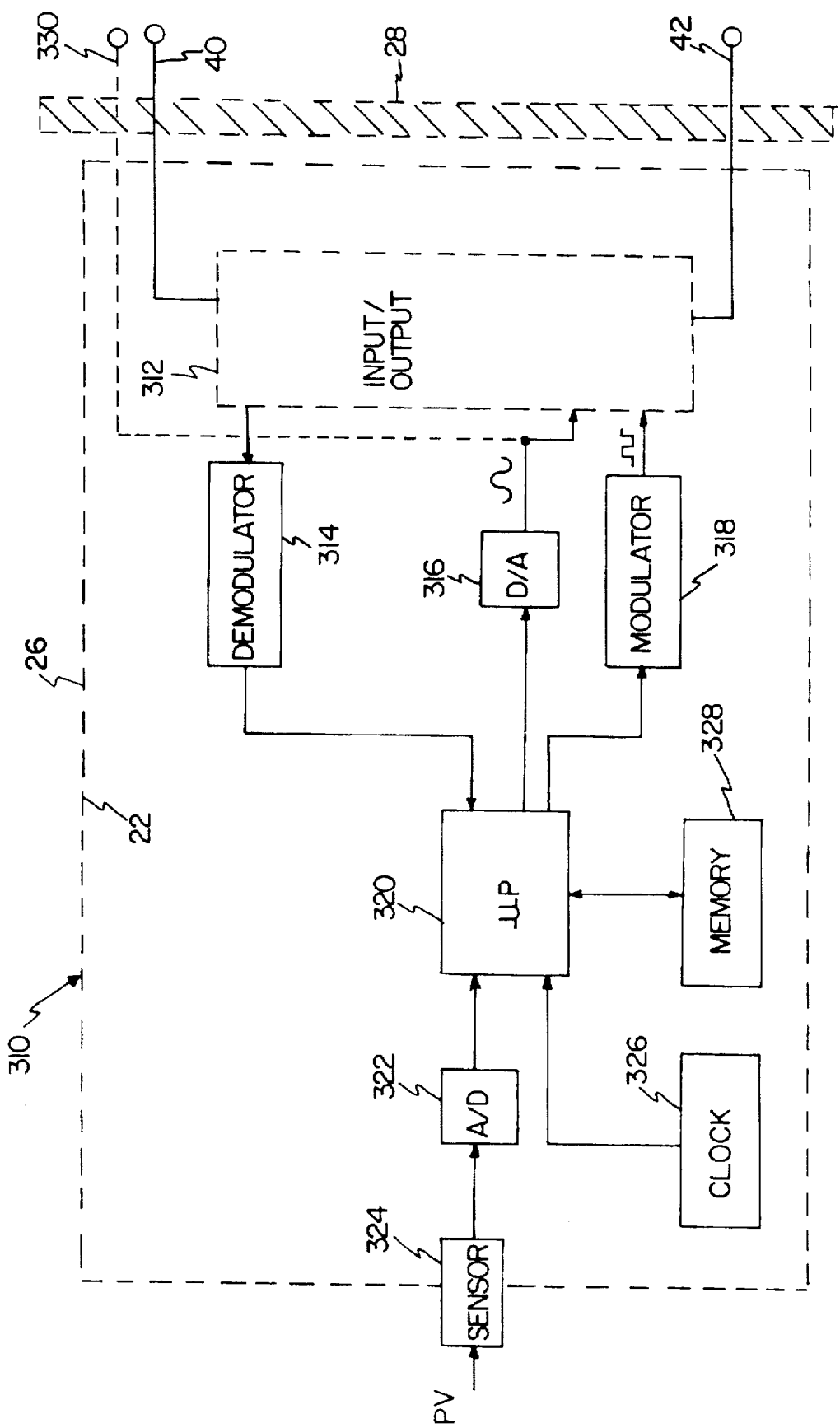
FIG. 5 is a block diagram of a transmitter which may be coupled to the interface module shown in FIG. 3.

FIG. 5 is a block diagram of an embodiment in which field instrument 14 includes a process variable measurement transmitter. Transmitter 310 includes electronics compartment 26 of housing 22, terminals 40 and 42 which extend through bulkhead 28, input-output circuit 312, demodulator 314, digital-to-analog (D/A) converter 316, modulator 318, microprocessor 320, analog-to-digital (A/D) converter 322, sensor 324, clock 326 and memory 328. Demodulator 314, D/A converter 316, modulator 318 and input-output circuit 320 are incorporated in a MODAC ASIC developed by Rosemount Inc. Incoming messages are demodulated by demodulator 314 and provided to microprocessor 320. Sensor 324 measures a process variable (PV) and generates a voltage, for example, which represents the measured process variable. A/D converter 322 converts the voltage to a digital value which is supplied to microprocessor 320. Sensor 324 can include an absolute temperature, differential temperature, differential pressure, absolute pressure, gauge pressure, flow, level and pH sensor, for example. Microprocessor 320 provides the process variable measurement to modulator 318 which modulates an analog signal generated by input-output circuit 312 on terminals 40 and 42.

As mentioned above, terminals 40 and 42 are typically secured to a terminal block in terminal compartment 28 (FIG. 1) for connection to a two-wire process control loop. The electro-optic interface of the present invention conveniently converts the electrical interface of field instrument 14 to an optical interface for communication over fiber 18.

Figure 6:
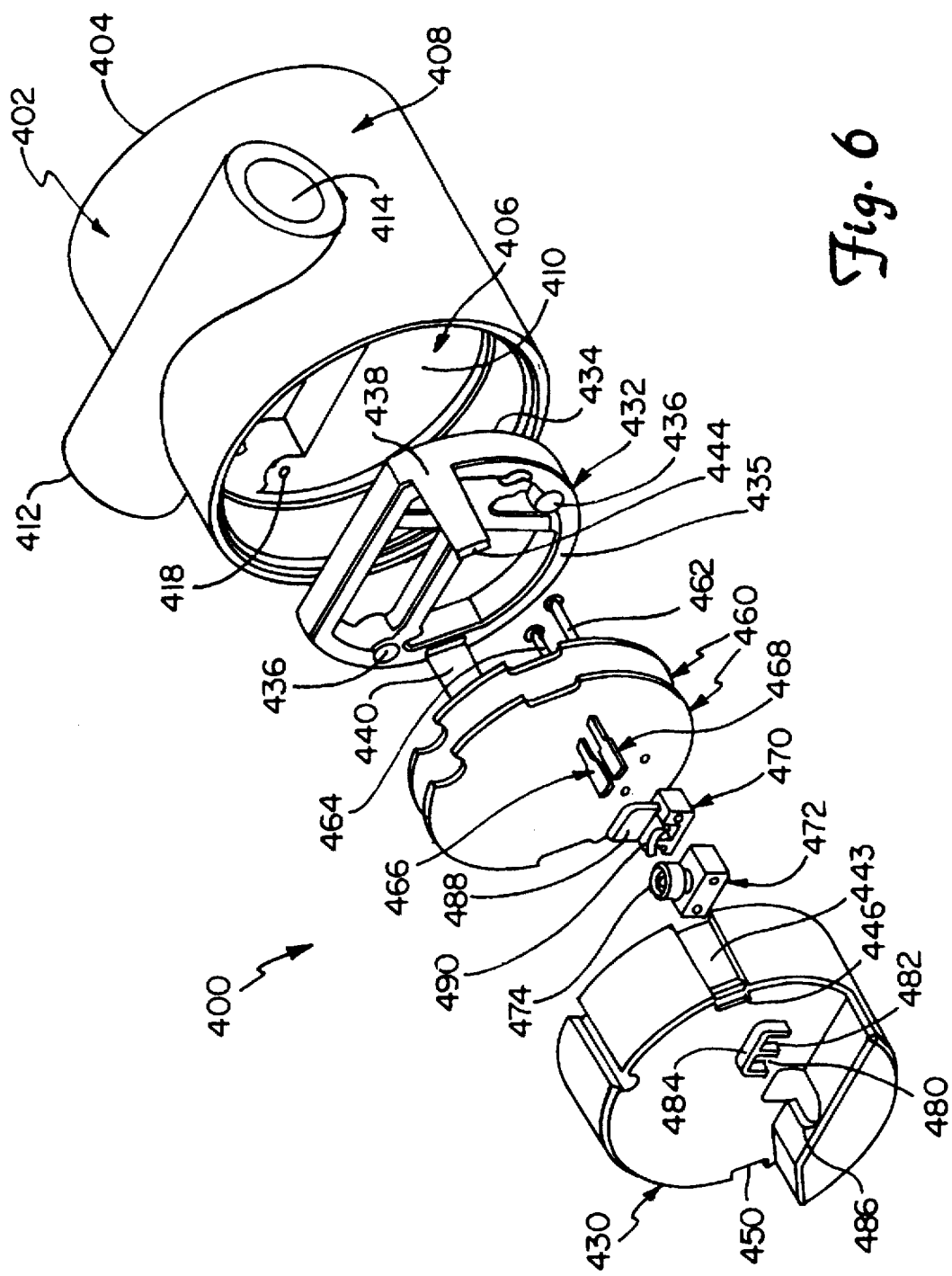
FIG. 6 is an exploded, perspective view of the interface module.

FIG. 6 is an exploded, perspective view of an interface module 400 which illustrates the packaging of the module in greater detail. The packaging of interface module 400 allows the module to be easily coupled to a family of differently sized field instruments 402, such as Fisher-Rosemount two-wire, 4-20 mA HART® devices. As a result, instruments in the field which have wire interfaces, such as two-wire process control loops, can be quickly converted to an optical interface with no change in the instrument electronics and with no addition of external hardware at the remote location.

As in the embodiment shown in FIG. 1, field instrument 402 includes a housing 404, a terminal compartment 406, an electronics compartment 408, a bulkhead 410, and access ports 412 and 414. The terminal block within terminal compartment 410 has been removed to expose mounting features 418 on bulkhead 10. Mounting features 418 can include a variety of different mounting features, such as a threaded screw bore for receiving a screw. The mounting features on bulkhead 410 may be the same or unique between the plurality of different sized field instruments.

Interface module 400 includes a universally-sized plastic shroud 430 which snaps onto a mounting plate 432. Plate 432 is preferably uniquely modified for each type or size of field instrument. When snapped onto mounting plate 432, shroud 430 fits within terminal compartment 410 either with the existing cover (shown in FIG. 1) or with an extended cover, as opposed to being mounted external to housing 404. An extended cover extends terminal compartment 406 to a volume sufficient to enclose interface module 400. The module is therefore protected from the environment and does not require a cumbersome mounting apparatus external to the housing. Also, spacial constraints surrounding instrument 402 can make an external mounting difficult.

Mounting plate 432 is preferably formed of molded plastic which has a first mounting surface 434 which mates with bulkhead 410 and a second mounting surface 435 which mates with shroud 430. A plurality of screw receptacles 436 extend through mounting plate 432 and mate with screw bores 418 in bulkhead 410.

Resilient flanges 438 and 440 extend from second mounting surface 435 toward shroud 430. Flanges 438 and 440 are flexible and can be deflected in directions generally opposite to one another. Flanges 438 and 440 mate with an outer diameter surface 443 of shroud 430. Flanges 438 and 440 have distal ends with inwardly facing latches 444 and 445 (445 not shown) which mate with receptacles 446 and 450 in shroud 430. Flanges 438 and 440 are separated from one another by a distance which is slightly smaller than outer diameter surface 443 of shroud 430 between receptacles 446 and 450 such that shroud 430 has a "snap-fit" in mounting plate 432 between flanges 438 and 440. Flanges 438 and 440 exert an inward force on their distal ends to keep latches 444 and 445 engaged in receptacles 446 and 450, respectively. In an alternative embodiment, shroud 430 is attached to mounting plate 432 by screws, fasteners or other mounting features.

The electronics within shroud 430 include one or more printed wiring assemblies or circuit boards 460, electrical leads 462 and 464, terminals 466 and 468, standoff 470, power converter 472 and fiber optic coupler 474. Printed wiring assemblies 460 carry the electronic components shown in FIG. 3. Leads 462 and 464 are adapted for connection to terminals 40 and 42 (shown in FIG. 1) when interface module 400 is mounted within terminal compartment 406. Electrical leads 462 and 464 are also connected to terminals 466 and 468 which extend through slots 480 and 482, respectively, in shroud 430, where the terminals can be accessed by a remote transmitter interface device or other test equipment. Slots 480 and 482 are partially surrounded by a raised wall 484 which protects terminals 466 and 468 from damage and prevents leads or wires attached to terminals 466 and 468 from shorting.

Standoff 470 is attached between power converter 472 and printed wiring assembly 460 to raise the power converter off the assembly so that fiber optic connector 474 can be accessed through an aperture 486 of shroud 430. Standoff 470 includes flanges 488 and 490 which extend at a right angle to one another and seal aperture 486 around fiber optic connector 474 when printed wiring assembly 460 is secured within shroud 430. Assembly 460 can be secured within shroud 430 by screws, a fastener or a flexible silicon potting material, such as an RTV potting. The potting material provides a convenient environmental seal.

Figure 7:
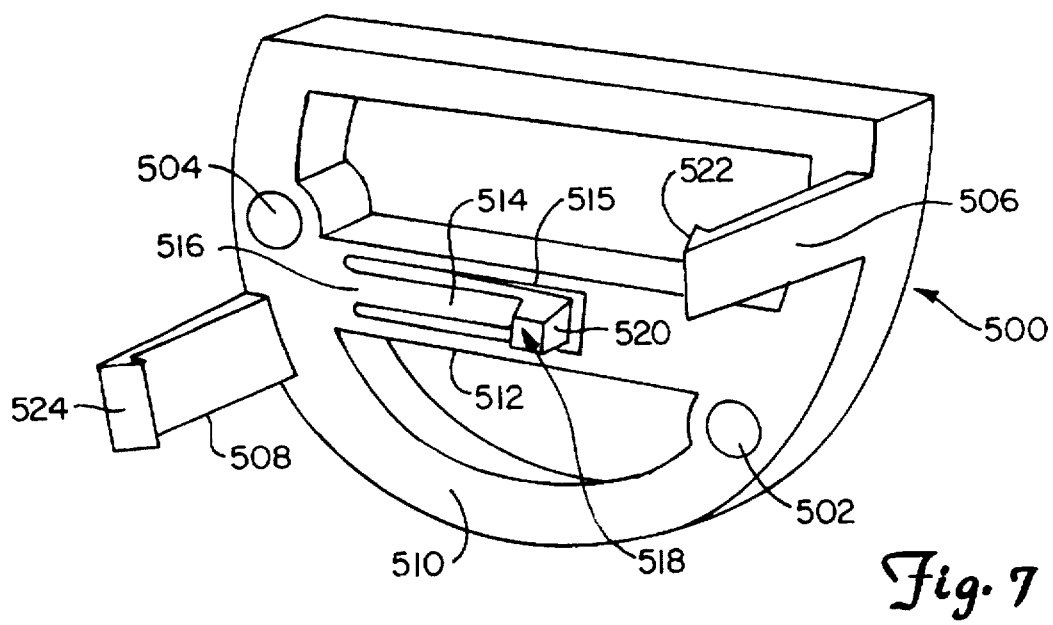
FIG. 7 is a perspective view of an alternative mounting plate according to the present invention.

FIG. 7 is a perspective view of an alternative mounting plate according to the present invention. Mounting plate 500 includes bulkhead mounting features 502 and 504 and shroud mounting features 506 and 508 which are similar to the mounting features shown in FIG. 6. Mounting plate 500 includes a circumferential base 510 with a strut 512 extending across a diameter of base 510. An anti-vibration spring 514 is formed within a slot 515 in strut 512. Spring 514 is cantilevered and attached to strut 512 at a proximal end 516.

A projection 518 is attached to a distal end 520 of spring 514. Projection 518 engages a back side of assembly 460 (shown in FIG. 6) when shroud 430 is attached to mounting plate 500. In an alternative embodiment, shroud 430 has a bottom surface which engages projection 518. Spring 514 exerts an outward force toward shroud 430 which reduces vibration between shroud 430 and mounting plate 500 by taking up any clearance between latches 522 and 524 and shroud receptacles 446 and 450 (FIG. 6). Spring 514 can be positioned at any location on mounting plate 500. Also, spring 514 can be formed integral with mounting plate 500 or can include a separate spring attached to mounting plate 500 or to shroud 430.

Figure 8:
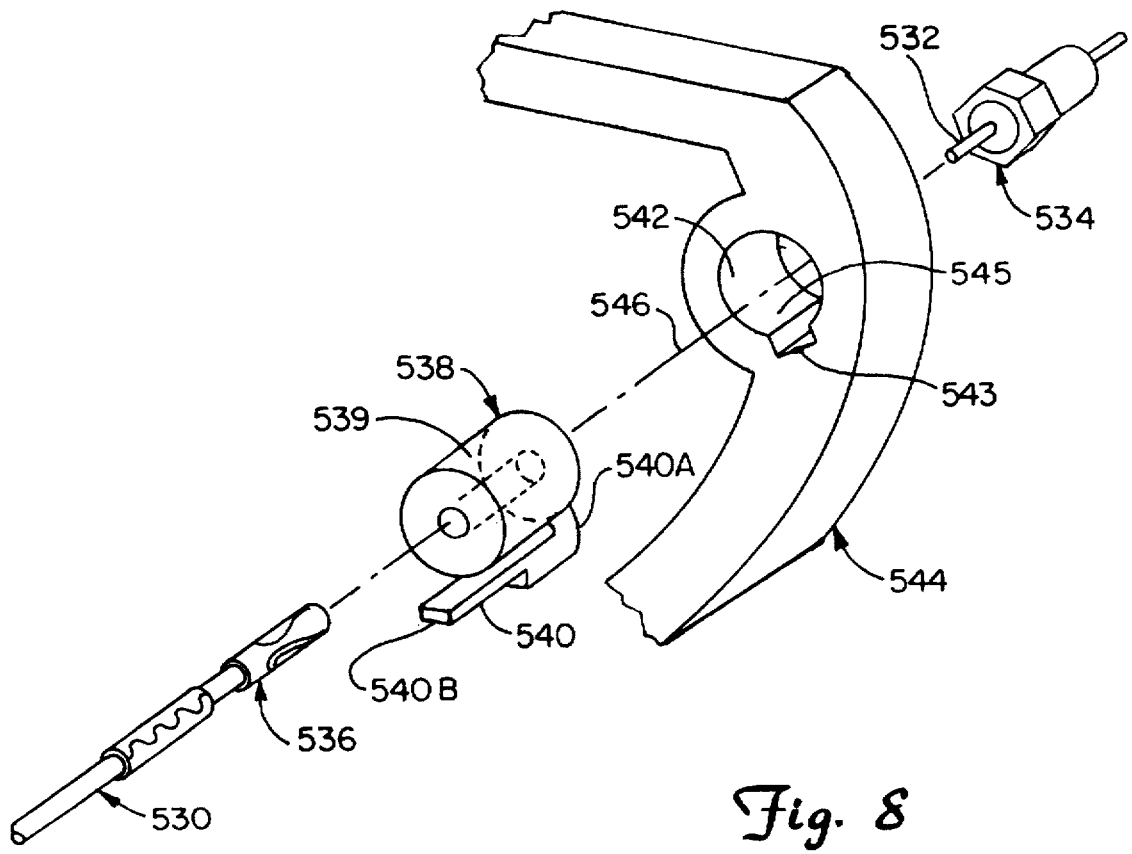
FIG. 8 illustrates a connection between interface module leads and bulkhead terminals.

FIG. 8 illustrates the connection between the electrical leads from the interface module and the electrical terminals in the bulkhead according to one embodiment of the present invention. Lead 530 extends from the interface module for connection to terminal 532. Lead 530 has a female-type connector 536 attached to its distal end. In some applications, the spring force of connector 536 may not be sufficient to hold lead 530 in place on terminal 532 under high vibration forces. Terminal 532 extends through an RFI filter 534 which is mounted in the bulkhead. In the embodiment shown in FIG. 8, connector 536 is mounted within a connector housing 538 having an outer diameter surface 539 with a cantilevered latch 540. Latch 540 has a proximal end 540a attached to outer diameter surface 539 and a distal end 540b spaced from the outer diameter surface. Connector housing 538 snaps into place within an aperture 542 in mounting plate 544. Distal end 540b is biased into a longitudinal slot 543 within an inner diameter surface 545 of aperture 542 to lock the connector housing within the aperture. Distal end 540b is deflectable toward outer diameter surface 539 to release the connector housing from the aperture.

Aperture 542 has an axis that is aligned with a longitudinal axis 546 of terminal 532 and RFI filter 534 so that connector 536 slides onto and frictionally engages terminal 532 when mounting plate 544 is secured to the bulkhead of the field instrument. Alternatively, connector 536 and connector housing 538 can be inserted into aperture 542 and onto terminal 532 after mounting plate 544 has been secured to the bulkhead.

Several alternative packaging configurations can also be used with the present invention. For example, the interface module can be mounted directly to the bulkhead of the field instrument housing and held in place with screws rather than through a mounting plate. Connector 536 can also be mounted on the circuit board of the interface module and aligned with longitudinal axis 546 of RFI filter terminal 532 so that the connector would plug directly onto terminal 532 and thereby eliminate the need for connecting wires. In addition, the shroud could be fastened to the mounting plate with screws rather than latches, which would eliminate the need for an anti-vibration spring.

The packaging of the present invention allows a plurality of differently sized traditional wire based field instruments to be quickly and conveniently converted to optical based instruments without changes to the instrument electronics or housing. Each interface module has a universally sized and shaped shroud which snaps onto a uniquely sized and shaped mounting plate. A unique, low-cost plastic plate can be made for adapting the universal shroud and enclosed electronics to each type of field instrument. The electro-optic interface of the present invention, including the power module, fiber, interface module, and mounting plate can be provided as a kit for converting existing field instruments to optical based systems or can be provided with new equipment.

Although the present invention has been described with reference to preferred embodiments, workers skilled in the art will recognize that changes may be made in form and detail without departing from the spirit and scope of the invention.

What is claimed is:

1. A remotely powered field instrument comprising:
   a housing with a terminal compartment, an electronics compartment, and a bulkhead separating the electronics compartment from the terminal compartment;
   an industrial process control transmitter circuit positioned within the electronics compartment;
   a process sensor electrically coupled to the industrial process control transmitter circuit;
   a first electrical lead extending through the bulkhead and electrically coupled to the industrial process control transmitter circuit;
   a mounting plate secured within the terminal compartment; and
   an interface module secured within the terminal compartment to the mounting plate and comprising an optical connector, an optical-to-electrical converter coupled to the optical connector and a second electrical lead coupled between the optical-to-electrical converter and the first electrical lead.

2. The remotely powered field instrument of claim 1 wherein the terminal compartment comprises an access port extending through the housing.

3. The remotely powered field instrument of claim 2 and further comprising an optical fiber extending through the access port and connected to the optical connector.

4. The remotely powered field instrument of claim 1 and further comprising a cover threaded to the terminal compartment.

5. The remotely powered field instrument of claim 1 wherein the terminal compartment has an internal mounting feature and the mounting plate has a first surface with a mounting feature that couples with the mounting feature of the terminal compartment.

6. The remotely powered field instrument of claim 5 wherein the mounting feature of the terminal compartment comprises a threaded screw bore and the mounting feature of the first surface comprises a screw receptacle aligned with the threaded screw bore.

7. The remotely powered field instrument of claim 1 wherein:
   the first electrical lead extending through the bulkhead has a longitudinal axis;
   the mounting plate has an aperture and a connector housing releasably secured within the aperture, the connector housing having a connector bore through the housing which has an axis that is aligned with the longitudinal axis of the first electrical lead; and
   the second electrical lead has a distal end with a female-type connector secured within the connector bore and frictionally engaging the first electrical lead.

8. The remotely powered field instrument of claim 7 wherein:
   the aperture comprises an inner diameter surface with a slot; and
   the connector housing comprises an outer diameter surface with a cantilevered latch which is biased into the slot and is deflectable to release the connector housing from the aperture.

9. The remotely powered field instrument of claim 1 wherein:
   the mounting plate comprises first and second flanges extending generally parallel to one another and spaced by a distance, wherein the first and second flanges are deflectable in directions generally opposite to one another and have an inner surface; and
   the interface module comprises an outer diameter surface which mates with the inner surfaces of first and second flanges.

10. The remotely powered field instrument of claim 9 wherein the first and second flanges have distal ends which are spaced from one another by the distance and wherein the interface module has a diameter between the first and second flanges which is greater than the distance.

11. The remotely powered field instrument of claim 9 wherein the first and second flanges have distal ends with inwardly facing latches and wherein the interface module has first and second receptacles which mate with the inwardly facing latches.

12. The remotely powered field instrument of claim 1 wherein the interface module has a bottom surface which faces the mounting plate and wherein the mounting plate has an anti-vibration spring biased against the bottom surface.

13. The remotely powered field instrument of claim 12 wherein the mounting plate comprises a slot and the anti-vibration spring comprises a cantilevered spring formed within the slot and having a distal end with a projection which faces and engages the bottom surface of the interface module.

14. The remotely powered field instrument of claim 1 wherein the interface module comprises:
- a shroud which forms an interface electronics compartment and has an upper surface with first and second apertures;
- an optical connector extending through the first aperture and coupled to the optical-to-electrical converter;
- a circuit board positioned within the interface electronics compartment and electrically connected to the second electrical lead and to the optical-to-electrical converter; and
- a first electrical terminal extending from the circuit board through the second aperture and electrically coupled to the second electrical lead.

15. The remotely powered field instrument of claim 1 wherein:
- the first electrical lead extending through the bulkhead has a longitudinal axis;
- the interface module comprises a circuit board which carries the optical-to-electrical converter and has a surface which faces the bulkhead;
- a female-type electrical connector electrically connected to the second electrical lead and secured to the circuit board surface, the connector being aligned with the longitudinal axis such that the connector frictionally engages the first electrical lead when the interface module is secured within the terminal compartment.

16. The remotely powered field instrument of claim 1 wherein the process sensor is selected from the group consisting of absolute temperature, differential temperature, differential pressure, absolute pressure, gauge pressure, flow, level and pH sensors.

17. The remotely powered field instrument of claim 1 wherein the first electrical lead forms part of a process control loop selected from the group consisting of two-wire, three-wire and four-wire process control loops.

18. An optical-electrical interface apparatus for attachment within a terminal compartment of a field instrument, comprising:
- a mounting plate for mounting in the terminal compartment and comprising first and second flanges extending generally parallel to one another and spaced by a distance, wherein the first and second flanges are deflectable in directions generally opposite to one another and have an inner surface;
- a shroud comprising an aperture and an external diameter surface which mates with the inner surfaces of the first and second flanges;
- an interface electronics compartment formed within the shroud;
- a circuit board positioned within the interface electronics compartment;
- an optical-to-electrical converter carried by the circuit board; and
- an optical connector optically coupled to the optical-to-electrical converter and extending through the aperture.

19. The optical-electrical interface apparatus of claim 18 wherein the first and second flanges have distal ends with inwardly facing latches and wherein the shroud has first and second receptacles which mate with the inwardly facing latches.

20. The optical-electrical interface apparatus of claim 18 wherein the mounting plate has an anti-vibration spring biased against one of the shroud and the circuit board.

21. An apparatus for converting a selected one of a plurality of differently sized, remotely powered industrial process field instruments having an electrical interface to a remotely powered industrial process field instrument having an optical interface, each field instrument being powered solely through the electrical interface and having a housing with a terminal compartment, a first electronics compartment, a bulkhead, and an electrical lead extending through the bulkhead from the first electronics compartment to the terminal compartment, and wherein the terminal compartment has a unique internal mounting feature, the apparatus comprising:
- a mounting plate having a first surface with a unique mounting feature which couples with the internal mounting feature of the selected field instrument, and having a second surface with a universal mounting feature; and
- a universal interface module comprising a housing which is sized to fit within the terminal compartments of the plurality of differently sized field instruments, a universal mounting feature which couples with the universal mounting feature of the mounting plate, an electrical terminal coupled to the electrical lead, an optical connector, and an optical-to-electrical converter which is coupled between the optical connector and the electrical terminal for powering the selected field instrument.

22. A kit for converting an interface between a field instrument and a controller from an electrical interface to an optical interface, the field instrument having an electrical lead and a housing which forms a terminal compartment and a first electronics compartment which are divided by a bulkhead, wherein the electrical lead extends through the bulkhead from the first electronics compartment to the terminal compartment, wherein the terminal compartment has a mounting feature, and wherein the controller has an electrical lead, the kit comprising:
- a power module having an electrical terminal for connection to the electrical lead of the controller, a first optical connector, and an electrical-to-optical converter coupled between the electrical terminal and the first optical connector;
- an optical fiber having first and second ends, the first end for connection to the first optical connector; and
- an interface module for attachment to the mounting feature within the terminal compartment, the interface module having an electrical terminal for connection to the electrical lead within the terminal compartment, a second optical connector for connection to the second end of the optical fiber, and an optical-to-electrical converter coupled between the second optical connector and the electrical terminal of the interface module.

23. The kit of claim 22 and further comprising an extended replacement cover for extending the terminal compartment to a volume sufficient to house the interface module when secured to the housing.

24. An optical-electrical interface apparatus for attachment to a mounting feature within a terminal compartment of a selected one of a plurality of differently sized field instruments, comprising:
- an optical-to-electrical interface module having a housing which is sized to fit within the terminal compartments of the plurality of differently sized field instruments and which has a universal mounting feature; and
- means for mounting the optical-to-electrical interface module within the terminal compartment of the selected field instrument, which comprises a first mounting feature which couples with the mounting feature of the selected field instrument and a second mounting feature which couples with the universal mounting feature of the optical-to-electrical interface module.

25. A remotely powered field instrument comprising:

a housing with a terminal compartment, an electronics compartment, and a bulkhead separating the electronics compartment from the terminal compartment, wherein the terminal compartment has an access port extending through the housing;

a first electrical lead extending through the bulkhead;

a mounting plate secured within the terminal compartment;

an interface module secured within the terminal compartment to the mounting plate and comprising an optical connector, an optical-to-electrical converter coupled to the optical connector and a second electrical lead coupled between the optical-to-electrical converter and the first electrical lead; and an optical fiber extending through the access port and connected to the optical connector.

* * * * *